United States Patent
Danno et al.

(10) Patent No.: US 9,587,327 B2
(45) Date of Patent: Mar. 7, 2017

(54) METHOD OF PRODUCTION OF SIC SINGLE CRYSTAL

(75) Inventors: Katsunori Danno, Susono (JP); Akinori Seki, Shizuoka (JP); Hiroaki Saitoh, Mishima (JP); Yoichiro Kawai, Okazaki (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 234 days.

(21) Appl. No.: 13/383,604

(22) PCT Filed: Jul. 17, 2009

(86) PCT No.: PCT/JP2009/063304
§ 371 (c)(1),
(2), (4) Date: Jan. 12, 2012

(87) PCT Pub. No.: WO2011/007457
PCT Pub. Date: Jan. 20, 2011

(65) Prior Publication Data
US 2012/0118221 A1     May 17, 2012

(51) Int. Cl.
| | | |
|---|---|---|
| *C30B 19/12* | (2006.01) | |
| *C30B 29/36* | (2006.01) | |
| *C30B 15/14* | (2006.01) | |
| *C30B 19/04* | (2006.01) | |
| *C30B 17/00* | (2006.01) | |

(52) U.S. Cl.
CPC .............. *C30B 29/36* (2013.01); *C30B 15/14* (2013.01); *C30B 17/00* (2013.01); *C30B 19/04* (2013.01)

(58) Field of Classification Search
CPC ................................. C30B 29/36; C30B 19/04
USPC ........................................................... 117/54
See application file for complete search history.

(56) References Cited

U.S. PATENT DOCUMENTS

| | | | |
|---|---|---|---|
| 3,511,610 A * | 5/1970 | Dohmen ...................... 117/203 |
| 2005/0183657 A1* | 8/2005 | Kusunoki et al. ................ 117/2 |
| 2007/0209573 A1 | 9/2007 | Kusunoki et al. |

FOREIGN PATENT DOCUMENTS

| | | | |
|---|---|---|---|
| EP | 1 806 437 | 7/2007 | |
| JP | 07-172998 | 7/1995 | |
| JP | 07172998 A * | 7/1995 | ............ C30B 29/36 |
| JP | 3079256 | 8/2000 | |
| JP | 2000-264790 | 9/2000 | |

(Continued)

OTHER PUBLICATIONS

International Search Report in International Application No. PCT/JP2009/063304; Mailing Date: Oct. 27, 2009.

*Primary Examiner* — Michael Kornakov
*Assistant Examiner* — Hua Qi
(74) *Attorney, Agent, or Firm* — Finnegan, Henderson, Farabow, Garrett & Dunner, LLP

(57) ABSTRACT

A method of production of a SiC single crystal uses the solution method to prevent the formation of defects due to seed touch, i.e., causing a seed crystal to touch the melt, and thereby cause growth of a SiC single crystal reduced in defect density. According to the method, a SiC seed crystal touches a melt containing Si in a graphite crucible to thereby cause growth of the SiC single crystal on the SiC seed crystal. The method includes making the SiC seed crystal touch the melt, and then making the melt rise in temperature once to a temperature higher than the temperature at the time of touch and also higher than the temperature for causing growth.

8 Claims, 4 Drawing Sheets

(56) References Cited

FOREIGN PATENT DOCUMENTS

| | | | | |
|---|---|---|---|---|
| JP | 2001-10896 | | 1/2001 | |
| JP | 2006-69861 | | 3/2006 | |
| JP | 2006-143555 | | 6/2006 | |
| JP | 2007-261844 | | 10/2007 | |
| JP | 2007261844 A | * | 10/2007 | |
| JP | 2007-284301 | | 11/2007 | |
| JP | 2007284301 A | * | 11/2007 | ............. C30B 29/36 |
| JP | 2008-159740 | | 7/2008 | |

* cited by examiner (1)  (2)

(1)  (2)

(1)  (2)

METHOD OF PRODUCTION OF SIC SINGLE CRYSTAL

TECHNICAL FIELD

The present invention relates to a method of production of a SiC single crystal by the solution method.

BACKGROUND ART

SiC has a larger energy band gap compared with Si, so various techniques for production of high quality SiC single crystal suitable for semiconductor materials have been proposed. As the method of production of SiC single crystal, up to now, various diverse methods have been tried out, but the sublimation method and the solution method are currently the most general. The sublimation method is fast in growth rate, but has the disadvantage that micropipes and other defects and transformation of the crystal polytype easily occur. Opposed to this, while the growth rate is relatively slow, these defects are not present in the solution method. This method is therefore considered promising.

The method of production of SiC single crystal by the solution method maintains a temperature gradient inside the Si melt in the graphite crucible where the temperature falls from the inside toward the melt surface. At the bottom high temperature part, the C which dissolves from the graphite crucible into the Si melt mainly rides the convection of the melt to rise and reach the low temperature part near the melt surface and become supersaturated there. If causing a SiC seed crystal which is held at the tip of a graphite rod to touch the melt surface, The supersaturated C crystallizes on the SiC seed crystal by epitaxial growth as a SiC single crystal. In the present application, the "growth temperature", "touch temperature", etc. mean the temperature at the melt surface.

A SiC single crystal, in particular for securing good device characteristics as a semiconductor material, has to have as low a density of dislocations and other lattice defects as possible. For this reason, it is important to make the single crystal grow so as to prevent the defect density of the seed crystal from being made to increase. If causing the seed crystal to touch the melt surface, the large temperature difference between the two will cause a large stress to be applied to the touch surface region of the seed crystal and the thin single crystal starting to grow, so lattice defects will occur. These will grow and lead to defects in the final single crystal.

Therefore, to prevent the occurrence of such defects, up to now, various proposals have been made regarding the method of making the seed crystal touch the melt.

Japanese Patent Publication (A) No. 7-172998 proposes to cause the seed crystal to descend to make it touch the melt surface at the point of time when the Si melt reaches a temperature lower than the growth temperature of 1700° C. by 100° C. and then make the temperature of the Si melt rise to the growth temperature to thereby cause the seed crystal surface to slightly melt and remove the work marks and oxide film present on the surface. However, with the method of this proposal, the temperature is only raised to the single crystal growth temperature, so the C supersaturation degree is insufficient and a good growth rate cannot be secured.

Further, the following proposals have been made.

Japanese Patent Publication (A) No. 2000-264790 proposes production of a SiC single crystal by the solution method comprising causing the seed crystal to touch the melt surface (seed touch) at the point of time of a growth temperature of ±100 to 150° C., allowing the melt to stand for a while until its temperature becomes the growth temperature, and causing the touch surface region of the seed crystal and/or the thin single crystal which has started to grow on the seed crystal to melt in the melt (meltback). However, if the concentration of C in the melt reaches a saturation concentration at the point of time of the seed touch, the SiC single crystal will start to grow immediately right after the seed touch and will become a heterogeneous polytype crystal, but crystal defects will occur. In the end, it is not possible to reliably prevent the occurrence of defects due to seed touch.

Japanese Patent Publication (A) No. 2007-261844 proposes to make a SiC single crystal grow by the solution method from a melt which contains Si, C, and Cr during which time causing the seed crystal to touch the melt after holding the melt for a predetermined time after the melt temperature reaches the growth temperature.

Japanese Patent Publication (A) No. 2006-143555 also makes a similar proposal.

In each case, it is not possible to reliably reduce defects caused by making the seed crystal touch the melt surface in the seed touch.

Further, Japanese Patent Publication (A) No. 2008-159740 proposes production of a SiC single crystal by the CVD method which comprises making a heating plate rise in temperature once up to a temperature region higher than the growth temperature before the start of SiC growth to clean the surface before growth, then causing the temperature to descend to the growth temperature to grow the SiC. In the CVD method, unlike the solution method, contamination of the heating plate surface is merely removed. This contributes nothing to the reduction of defects caused by the seed touch in the growth of the SiC single crystal by the solution method.

Further, Japanese Patent No. 3079256 proposes to use the sublimation method to grow a SiC single crystal during which time firing an energy beam ($CO_2$ gas laser beam) at the substrate or substrate holder so as to control the temperature inside the crystal during growth. This is also art for controlling the temperature profile in the crystal in the sublimation method—which is different from the solution method. It does not contribute anything to the reduction of defects due to the seed touch in the growth of SiC single crystal by the solution method.

SUMMARY OF INVENTION

The present invention has as its object the provision of a method of production of a SiC single crystal using the solution method which prevents the formation of defects due to seed touch, i.e., causing seed crystals to touch the melt, and thereby causes growth of a SiC single crystal reduced in defect density.

To achieve the above object, according to the present invention, there is provided a method of production of a SiC single crystal by causing a SiC seed crystal to touch a melt containing Si in a graphite crucible to thereby cause growth of the SiC single crystal on the SiC seed crystal, characterized by making the SiC seed crystal touch the melt, then making the melt rise in temperature once to a temperature higher than the temperature at the time of touch and also higher than the temperature for causing growth.

According to the present invention, the solution is made to rise in temperature once to a temperature which is higher than the temperature at the time of seed touch and also higher than the growth temperature, so it is possible to remove defects formed at the time of seed touch by meltback. In addition, after raising the temperature once, the growth is performed at a growth temperature lower than that, so it is possible to raise the C supersaturation degree at the initial stage and possible to grow the crystal at a fast speed.

DESCRIPTION OF EMBODIMENTS

Figure 1:
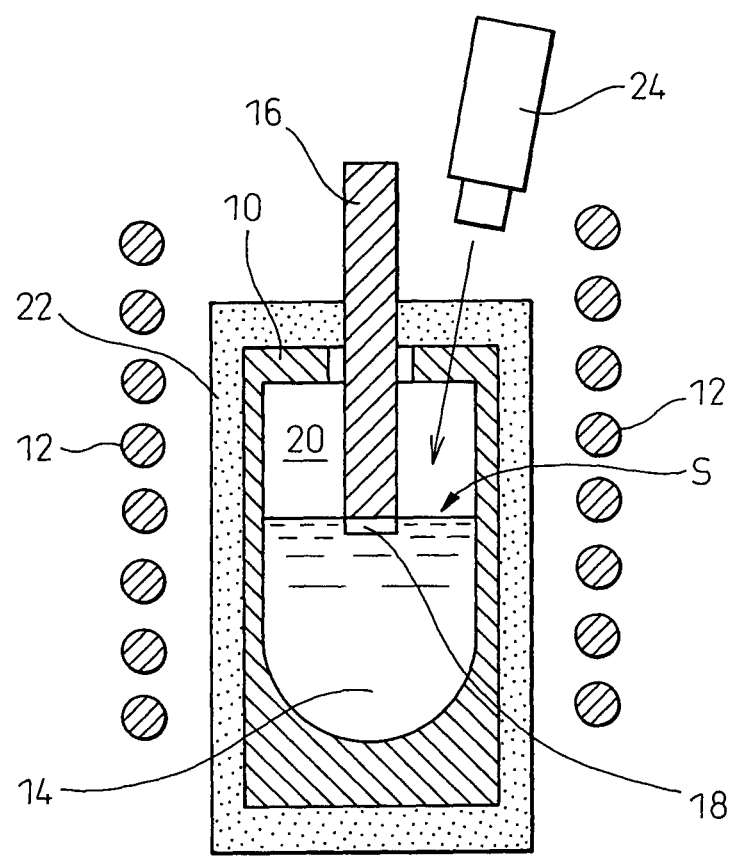
FIG. 1 shows the basic structure of a SiC single crystal growth system using the solution method which is suitable for use of the method of the present invention.

FIG. 1 shows the basic structure of a growth system of a SiC single crystal using the solution method which is suitable for use of the method of the present invention.

A graphite crucible 10 is surrounded by a high frequency heating coil 12. This is used to heat and melt feedstock inside of the crucible 10 to form a solution 14. From above that, a SiC seed crystal 18 which is supported at the bottom end of a graphite support rod 16 is made to descend to touch the surface S of the solution 14. A SiC single crystal is made to grow at the bottom surface of the SiC seed crystal 18 in an Ar gas or other inert atmosphere 20.

The graphite crucible 10 is covered in its entirety by a heat insulating material 22. The temperature of the surface S is measured by a radiant thermometer 24 by a noncontact method.

The radiant thermometer 24 can be set at an observation window where the surface S can be directly viewed. The temperature of the surface before and after the seed crystal 18 is made to touch the solution 14 can therefore be measured.

In general, Si is charged into the graphite crucible 10 as the feedstock of the Si melt and is heated by the high frequency heating coil 12 to form a Si melt. From the inside walls of the graphite crucible 10, C dissolves into this Si melt whereby an Si—C solution 14 is formed. In this way, the C source of the SiC is basically the graphite crucible 10, but it is also possible to supplementarily charge graphite blocks. Further, the crucible 10 may also be made of SiC. In that case, it is essential to charge graphite blocks as the C source.

Further, when adding elements for promoting dissolution of C into the melt (for example, Cr), first, as the melt feedstock, it is possible to charge Cr along with Si into the crucible 10 and heat to form the Si—Cr melt.

In the present invention, it is possible to apply the following modes to the seed crystal.

In one mode of the present invention, before the seed touch, it is also effective to heat the shaft which supports the seed crystal (graphite support rod) so as to preheat the seed crystal. This enables a local drop in the solution temperature due to the seed touch and the resultant occurrence of the problems explained above to be prevented.

In another mode, the shaft which holds the seed crystal is heated to reinforce the meltback effect while the temperature is raised after the seed touch. This enables the temperature gradient from the solution to the seed crystal to be reduced or reversed and the meltback effect to be reinforced.

In another mode, it is possible to fire a laser beam at the seed crystal before the seed touch so as to preheat the seed crystal. By directly heating the seed crystal rather than the support shaft, it is possible to more precisely control the preheating temperature of the seed crystal.

Figure 2:
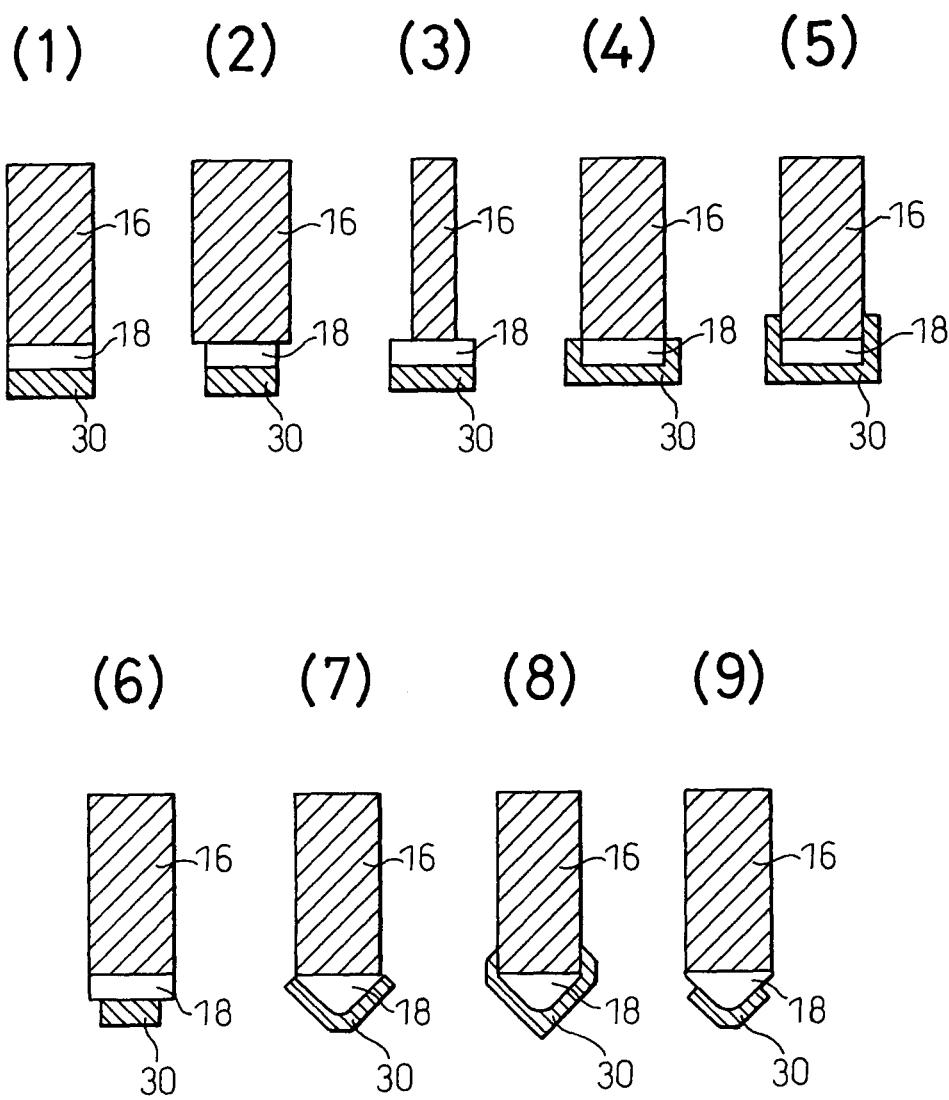
FIGS. 2(1) to (9) show various states of coating a seed crystal.

In another mode, as shown in FIGS. 2(1) to (9), it is possible to provide the seed crystal 18 with a protective coating 30. Reference numeral 16 represents the support shaft. For the coating 30, a metal, Si, C, or other material not detrimentally affecting the growth even if mixed into the solution is used. The surface coating melts and gives off heat at the time of the seed touch, due to which the heat shock at the time of seed touch can be eased. At the same time, it is possible to prevent abnormal growth due to vapor of the solution depositing on the surface of the SiC single crystal (formation of a polycrystal etc.) In particular, if selecting the coating material, an increase in the growth rate can also be expected.

Figure 3:
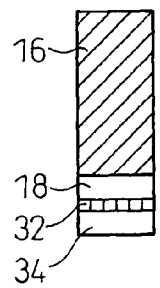
FIGS. 3(1) to (2) show various states of attachment of small pieces to a seed crystal.
Figure 3:
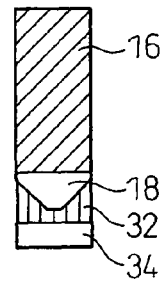

In another mode, as shown in FIGS. 3(1) to (2), it is also possible to make small pieces 34 of SiC, Si, or other materials not having a detrimental effect on the growth even if mixed into the solution adhere to the surface of the seed crystal 18 by a C adhesive or $SiO_2$ film etc. 32. While it is not possible to ease the heat shock like with the above protective coating 30, it is possible to prevent abnormal growth due to deposition of the vapor of the solution on the surface of the SiC single crystal (formation of polycrystals etc.). Further, the seed touch surface (surface on which small pieces are adhered) and growth surface (seed crystal surface) are separated, so it is possible to avoid the formation of defects at the initial growth layer.

Figure 4:
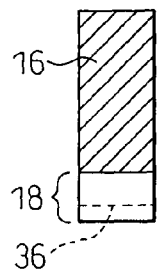
FIGS. 4(1) to (2) show various states of injecting ions into a seed crystal.
Figure 4:
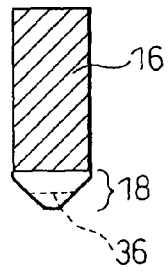

In another mode, as shown in FIGS. 4(1) to (2), it is possible to inject ions 36 into the seed crystal 18. Due to disassociation at the ion injection part 36 due to the temperature rise, the seed touch surface and the growth surface can be separated and the growth surface can be kept cleaner. Further, contamination of the solution by foreign matter can be prevented.

Figure 5:
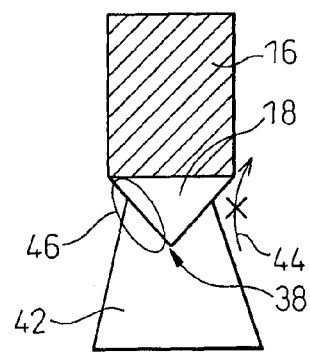
FIGS. 5(1) to (2) show various stages of formation of the tip of a seed crystal into a pointed or plateau shape.
Figure 5:
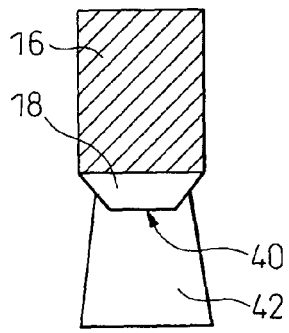

In another embodiment, as shown in FIGS. 5(1) to (2), the tip of the seed crystal (1) may be made a pointed shape (38) or (2) may be made a plateau shape (40). It is therefore possible to minimize the location where defects are formed at the time of seed touch and possible to grow the crystal after adjusting the area of the growth surface by subsequent meltback. The risk of formation of defects is avoided and simultaneously the crystal can be easily increased in size (a SiC single crystal is generally difficult to increase in size). Furthermore, the starting part of growth is a narrowed shape, so there is also the effect of prevention of the solution rising up (44) and wetting the support shaft 16. At the pointed or plateau shaped inclined part 46, the 4H—SiC stacked structure of the seed crystal 18 is exposed. Even with a larger size SiC single crystal 42, a 4H—SiC structure of the same stacked order continued is easily obtained.

EXAMPLES

The following procedure was used to grow a SiC single crystal.

Basic Crystal Growth Process

Growth preparations (see FIG. 1)

(1) Adhere 4H—SiC seed crystal 18 to graphite support shaft 16.

(2) Charge graphite crucible 10 with feedstock.

(3) Configure these as shown in FIG. 1

(4) Introduce Ar 20 at atmospheric pressure.

(5) Raise temperature to desired level

Seed touch (1) After temperature of solution 14 reaches sufficient temperature, make support shaft descend.

(2) Make shaft 16 descend until seed crystal 18 touches solution 14 and penetrates it desired depth (*), then make shaft stop. (*: In the present example, make it stop at position where seed crystal 18 touches surface of solution 14. In general, seed crystal 18 sometimes sinks into solution 14.)

Growth (2) Make solution temperature rise to desired growth temperature.

(2) Hold for any time to grow crystal, then pull up shaft 16.

(3) Cool shaft 16 and solution 14 over several hours.

Below, the specific procedure and conditions for the example of the present invention and comparative examples outside the scope of the present invention will be explained.

Comparative Example 1

A Si melt was used for growth on a 4H—SiC seed crystal. The seed touch temperature and the growth temperature were both about 1950° C. At this time, it was possible to obtain a SiC single crystal of a thickness of about 100 µm in a growth time of about 1 hour. This crystal was etched by molten KOH. The dislocations at the crystal surface were brought out as etch pits. The density of etch pits was $3\times10^5$ $cm^{-2}$. This clearly increased over the defect density level of $10^3$ $cm^{-2}$ of the seed crystal.

Comparative Example 2

The seed touch temperature and growth temperature were both made 1850° C. and growth was performed for 1 hour. At this time, a thickness 100 µm or so SiC single crystal was obtained. This crystal was etched by molten KOH, whereby the density of etch pits was $1\times10^5$ $cm^{-2}$.

Comparative Example 3

The seed touch temperature and growth temperature were both made 1710° C. and growth was performed for 1 hour. At this time, at the maximum a 140 µm/hr growth rate was obtained. The density of etch pits was $4\times10^5$ $cm^{-2}$.

Comparative Example 4

The seed touch was performed at room temperature (about 10° C.) (solid material before stock solution), then the temperature was raised to 1950° C. and growth was performed for 1 hour. Due to this, a thickness 100 µm or so SiC single crystal was obtained. The etch pit density was $4\times10^3$ $cm^{-2}$. The seed crystal used had a dislocation density of 1 to $10\times10^3$ $cm^{-2}$, so it was learned that almost no dislocations formed during the growth.

Comparative Example 5

The seed touch was performed at 1600° C., then the temperature was raised to 1950° C. and growth performed for 1 hour. Due to this, a thickness 100 µm or so SiC single crystal was obtained. The etch pit density was $2\times10^3$ $cm^{-2}$. The seed crystal used had a dislocation density of 1 to $10\times10^3$ $cm^{-2}$, so it was learned that almost no dislocations formed during the growth.

Comparative Example 6

The seed touch was performed at 1780° C., then the temperature was raised to 1950° C. and growth performed for 1 hour. The density of etch pits was $6\times10^3$ $cm^{-2}$.

Comparative Example 7

The seed touch was performed at 1850° C., then the temperature was raised to 1950° C. and growth performed for 1 hour. The density of etch pits was $4\times10^3$ $cm^{-2}$.

Comparative Example 8

The seed touch was performed at 1900° C., then the temperature was raised to 1950° C. and growth performed for 1 hour. When holding the temperature before the seed touch, an increase in the dislocation density (order if $10^5$ $cm^{-2}$) was observed, but when not holding the temperature before the seed touch and performing the seed touch at the point of time when reaching 1900° C. in the temperature elevation process and raising the temperature to 1950° C. for growth, the dislocation density was $3\times10^3$ $cm^{-2}$.

Comparative Example 9

The seed touch was performed at 1870° C., then the temperature was raised to 2020° C. and growth performed for 1 hour. The density of etch pits was the same extent as the seed crystal ($1\times10^4$ $cm^{-2}$).

Example 1

The growth temperature was made 1800° C. and the seed touch was performed at the point of time of raising the temperature to this temperature. Right after the seed touch, the temperature was raised to 1900° C., then the temperature was lowered to the growth temperature 1800° C. and growth performed for 1 hour. The obtained crystal had an etch pit density of the same extent as that of the seed crystal ($1\times10^4$ $cm^{-2}$).

Figure 6:
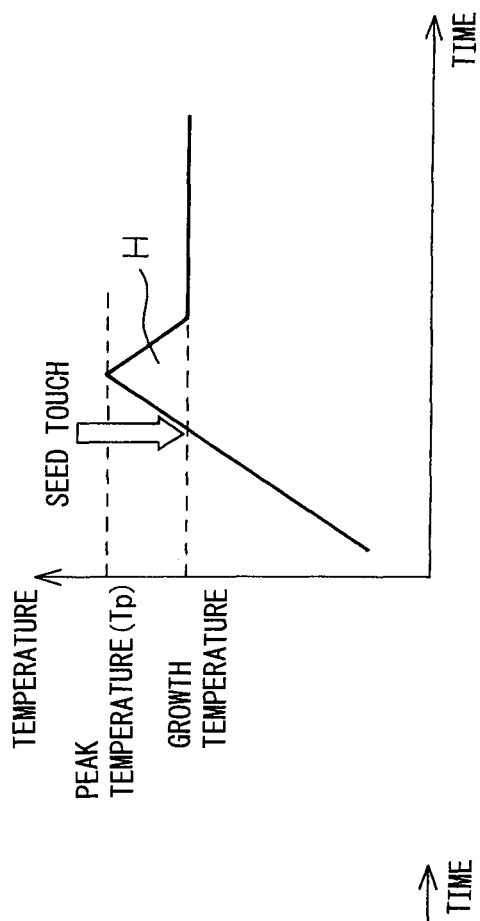
FIG. 6 shows the relationship between temperature (ordinate) and time (abscissa) for explaining two modes A and B for raising the temperature after seed touch to a temperature which is higher than the seed touch temperature and a temperature which is higher than the growth temperature.
Figure 6:
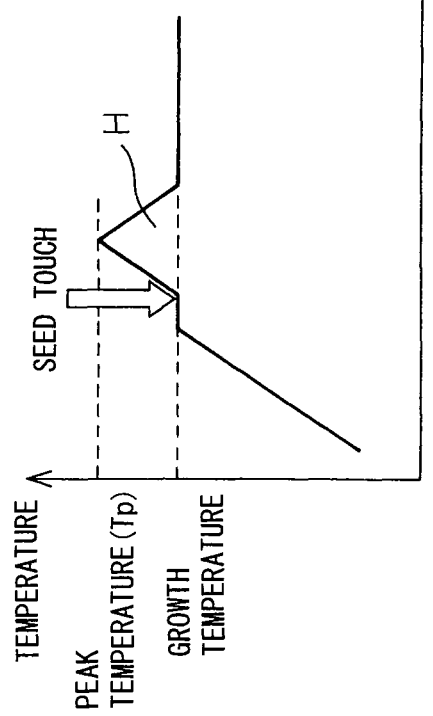

The progress in the process of Example 1 is shown in FIG. 6. The mode (A) comprises holding the temperature at a growth temperature of 1800° C. then performing the seed touch, while the mode (B) comprises performing the seed touch while not holding the temperature at the growth temperature. So long as performing the process H for raising the temperature once after a seed touch, either of the mode (A) or (B) may be used.

The results obtained by the above examples and Comparative examples are shown together in Table 1.

TABLE 1

| Class | Seed touch temperature (° C.) | Temperature elevation after reaching growth temperature (° C.) | Growth temperature (° C.) | Etch pit density (cm$^{-2}$) |
|---|---|---|---|---|
| Comp. Ex. 1 | 1950 | (No elevation) | 1950 | 3 × 10$^5$ |
| Comp. Ex. 2 | 1850 | (No elevation) | 1850 | >1 × 10$^5$ |
| Comp. Ex. 3 | 1710 | (No elevation) | 1710 | 3 × 10$^5$ |
| Comp. Ex. 4 | Room temperature | (No elevation) | 1950 | 4 × 10$^3$ |
| Comp. Ex. 5 | 1600 | (No elevation) | 1950 | 2 × 10$^3$ |
| Comp. Ex. 6 | 1780 | (No elevation) | 1950 | 6 × 10$^3$ |
| Comp. Ex. 7 | 1850 | (No elevation) | 1950 | 4 × 10$^3$ |
| Comp. Ex. 8 | 1900 | (No elevation) | 1950 | 3 × 10$^3$ |
| Comp. Ex. 9 | 1870 | (No elevation) | 2020 | 1 × 10$^4$ |
| Example 1 | 1800 | 1900 | 1800 | 7 × 10$^3$ |

The dislocation density of the seed crystals used here was 1 to 10×10$^2$ cm$^{-2}$. As opposed to this, a clear difference is recognized in the results of Comparative Examples 1 to 3, but in Comparative Examples 4 to 9 and Example 1, the results were equal to those of the seed crystals. There was no large difference.

Therefore, according to the present invention, it is learned that by performing the seed touch, then raising the temperature once, the low defect density obtained at a low temperature of less than 1800° C. in the comparative example is obtained even with a 1800° C. high temperature seed touch. From this, the possibility is suggested that a good SiC single crystal with low defect density can be grown even with a higher temperature seed touch. That is, in the examples, the seed touch was performed at the growth temperature, but the invention does not particularly have to be limited to this. The seed touch may be performed at a lower temperature or higher temperature than the growth temperature. After the seed touch, the temperature is raised once to a temperature higher than the seed touch temperature and a temperature higher than the growth temperature, then the temperature is lowered to the growth temperature and growth performed. This is the characterizing feature of the present invention.

Furthermore, since the temperature is raised once, then is lowered to the growth temperature, the supersaturation degree at growth temperature becomes higher and the initial growth rate of the SiC single crystal is enhanced.

INDUSTRIAL APPLICABILITY

According to the present invention, there is provided a method of production of a SiC single crystal using the solution method which prevents the formation of defects due to causing seed crystals to touch the melt in seed touch, and thereby causes growth of a SiC single crystal reduced in defect density.

The present invention can be used for SiC bulk crystal growth and epitaxial growth. A bulk crystal and epitaxial growth layer obtained by these growth methods are also provided.

The present invention further can be used to form a buffer layer between a wafer and an epitaxial growth layer. A buffer layer formed by this is also provided.

The present invention can furthermore be used for formation of a dislocation reducing layer on a seed crystal surface. The off angle of this dislocation reducing layer can be adjusted, then bulk growth performed to form a low dislocation bulk crystal.

The invention claimed is:

1. A method of producing a SiC single crystal by causing a SiC seed crystal to touch a melt containing Si having a temperature gradient inside the melt in a graphite crucible wherein the temperature of the melt decreases from the inside toward the melt surface to thereby cause growth of the SiC single crystal on the SiC seed crystal, the method comprising:
    (a) making said SiC seed crystal touch the melt while continuously increasing the temperature of the melt to a peak temperature higher than the temperature at the time of touch and also higher than the temperature for causing growth, without holding the temperature at the time of touch, and
    (b) lowering the temperature of the melt previously risen during (a) to the temperature for causing growth and holding the lowered temperature of the melt so as to grow the SiC single crystal,
    wherein a shaft which holds the SiC seed crystal is heated to reduce or reverse the temperature gradient from the inside of the melt toward the melt surface while the temperature of the melt is raised after the seed touch.

2. The method of producing a SiC single crystal as set forth in claim 1, wherein said SiC seed crystal touches the melt at said temperature for causing growth.

3. The method of producing a SiC single crystal as set forth in claim 1, wherein, before the SiC seed crystal touches the melt, a shaft which supports the SiC seed crystal is heated to preheat the SiC seed crystal.

4. The method of producing a SiC single crystal as set forth in claim 1, wherein, before the SiC seed crystal touches the melt, the SiC seed crystal is irradiated with a laser beam to preheat the SiC seed crystal.

5. The method of producing a SiC single crystal as set forth in claim 1, wherein, before the SiC seed crystal touches the melt, the SiC seed crystal is provided with a protective coating.

6. The method of producing a SiC single crystal as set forth in claim 1, wherein, before the SiC seed crystal touches the melt, small pieces are adhered to a surface of the SiC seed crystal.

7. The method of producing a SiC single crystal as set forth in claim 1, wherein, before the SiC seed crystal touches the melt, ions are injected into the SiC seed crystal.

8. The method of producing a SiC single crystal as set forth in claim 1, wherein a tip of the SiC seed crystal has a pointed shape or a plateau shape.

* * * * *